(12) United States Patent
Wu et al.

(10) Patent No.: US 10,403,799 B1
(45) Date of Patent: Sep. 3, 2019

(54) STRUCTURE WITH MICRO DEVICE

(71) Applicant: PlayNitride Inc., Tainan (TW)

(72) Inventors: Chih-Ling Wu, Tainan (TW); Yi-Min Su, Tainan (TW); Yu-Yun Lo, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/212,697

(22) Filed: Dec. 7, 2018

Related U.S. Application Data

(60) Provisional application No. 62/607,325, filed on Dec. 19, 2017.

(30) Foreign Application Priority Data

Jun. 5, 2018 (TW) ............... 107119254 A

(51) Int. Cl.
| | | |
|---|---|---|
| H01L 33/50 | (2010.01) |
| H01L 33/32 | (2010.01) |
| H01L 33/60 | (2010.01) |
| H01L 33/56 | (2010.01) |
| H01L 33/62 | (2010.01) |

(52) U.S. Cl.
CPC ............ *H01L 33/502* (2013.01); *H01L 33/32* (2013.01); *H01L 33/56* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | | |
|---|---|---|---|---|
| 2013/0228793 A1* | 9/2013 | Kim | ............. | H01L 27/153 257/76 |
| 2015/0236203 A1* | 8/2015 | Oh | ............. | G02B 6/0073 362/611 |
| 2015/0349205 A1* | 12/2015 | Chen | ............. | H01L 33/38 257/99 |
| 2016/0072012 A1* | 3/2016 | Chen | ............. | H01L 33/145 257/101 |
| 2016/0351548 A1* | 12/2016 | Chen | ............. | H01L 22/20 |
| 2017/0062666 A1* | 3/2017 | Bang | ............. | H01L 33/46 |

* cited by examiner

*Primary Examiner* — Bilkis Jahan
(74) *Attorney, Agent, or Firm* — JCIPRNET

(57) ABSTRACT

A structure with micro device including a substrate, at least one micro device, at least one holding structure, and at least one buffering structure is provided. The micro device is disposed on the substrate and has a top surface away from the substrate, a bottom surface opposite to the top surface, and a circumferential surface connecting the top surface and the bottom surface. The holding structure is disposed on the substrate. From the cross-sectional view, a thickness of the holding structure in a normal direction of the substrate gradually increases from the boundary of the top surface and the circumferential surface to the substrate. The buffering structure is disposed between the holding structure and the substrate. The holding structure is connected to the substrate through the buffering structure.

19 Claims, 8 Drawing Sheets

STRUCTURE WITH MICRO DEVICE

CROSS-REFERENCE TO RELATED APPLICATION

This application claims the priority benefits of U.S. provisional application Ser. No. 62/607,325, filed on Dec. 19, 2017 and Taiwan application serial no. 107119254, filed on Jun. 5, 2018. The entirety of each of the above-mentioned patent applications is hereby incorporated by reference herein and made a part of this specification.

BACKGROUND OF THE INVENTION

Field of the Invention

The invention is related to a semiconductor structure, and particularly to a structure with micro device.

Description of Related Art

In current techniques, transfer of micro light emitting diode (LED) is conducted mainly through the means of electrostatic force or magnetic force to transfer the micro LED on a carrier to a receiving substrate. Typically, the micro LED is held through a holding structure such that the micro LED can be picked up more easily from the carrier as well as delivered and transferred to be placed on the receiving substrate; moreover, the quality of the micro LED is not easily affected by other factors through use of the holding structure to hold the micro LED in the transferring process. However, the size and shape of a contact area between the holding structure and the micro LED affect the yield rate of delivery and transfer of the micro LED. In light of the above, it has become an important issue for related industries to find out how to make the holding structure to temporarily hold the micro LED and make the micro LED to be delivered and transferred between the carrier and the receiving substrate more easily and effectively.

SUMMARY OF THE INVENTION

The invention provides a structure with micro device, capable of effectively improving yield rate of delivery and transfer of micro device.

According to the invention, a structure with micro device includes a substrate, at least one micro device, at least one holding structure and at least one buffering structure. The micro device is disposed on the substrate and has a top surface away from the substrate, a bottom surface opposite to the top surface and a peripheral surface connecting the top surface and the bottom surface. The holding structure is disposed on the substrate. From a cross-sectional view, a thickness of the holding structure in a normal direction of the substrate is gradually increased from a boundary between the top surface and the peripheral surface of the micro device to the substrate. The buffering structure is disposed between the holding structure and the substrate, wherein the holding structure is connected to the substrate through the buffering structure.

According to an embodiment of the invention, the holding structure completely exposes the top surface of the micro device and covers the buffering structure.

According to an embodiment of the invention, the holding structure includes a plurality of covering portions and a plurality of connecting portions. The covering portions are separated from each other and cover a portion of the top surface. Each of the connecting portions connects the covering portions from an edge of the top surface and covers the buffering structure.

According to an embodiment of the invention, a largest distance is formed between each of the covering portions and a corresponding edge of the top surface, and a ratio of the largest distance to the length of the edge is smaller than or equal to 0.2.

According to an embodiment of the invention, a ratio of a width of each of the connecting portions on the edge of the top surface to a length of the corresponding edge is in a range between 0.01 and 0.6.

According to an embodiment of the invention, the smallest distances from an orthogonal projection of the center of the micro device on the substrate to the orthogonal projection of each of the covering portions on the substrate are the same.

According to an embodiment of the invention, the holding structure includes a covering portion and at least one connecting portion. The covering portion covers a portion of the top surface, and the connecting portion connects the covering portion from an edge of the top surface and covers the buffering structure.

According to an embodiment of the invention, a ratio of a width of the connecting portion on the edge of the top surface to a length of the corresponding edge is in a range between 0.01 and 0.6.

According to an embodiment of the invention, in a unit area, a ratio of the orthogonal projection area of the buffering structure on the substrate to the orthogonal projection area of the holding structure on the substrate is in a range between 0.2 and 0.9.

According to an embodiment of the invention, the buffering structure is away from the micro device.

According to an embodiment of the invention, a smallest distance is formed between the orthogonal projection of the buffering structure on the substrate and the orthogonal projection of the micro device on the substrate, and the smallest distance is smaller than or equal to 10 μm.

According to an embodiment of the invention, a ratio of the orthogonal projection area of the holding structure on the top surface of the micro device to the area of the top surface is smaller than or equal to 0.2.

According to an embodiment of the invention, the material of the holding structure is different from the material of the buffering structures, and the Young's modulus of the holding structure is larger than the Young's modulus of the buffering structures.

According to an embodiment of the invention, the micro device further includes an insulting layer, the insulating layer at least covers the peripheral surface and a portion of the bottom surface, and the holding structure is directly in contact with the insulating layer.

According to an embodiment of the invention, the material of the holding structure is different from the material of the insulating layer.

According to an embodiment of the invention, the thickness of the holding structure is smaller than or equal to the thickness of the insulating layer.

According to an embodiment of the invention, the center of gravity of the holding structure is lower than the center of gravity of the micro device.

According to an embodiment of the invention, the width of the top surface is larger than the width of the bottom surface.

Based on the above, in the design of the structure with micro device of the invention, from the cross-sectional view, thickness of the holding structure in the normal direction of the substrate is gradually increased from the boundary between the top surface and the peripheral surface of the micro device to the substrate. In other words, the holding structure has the smallest thickness at the boundary between the top surface and the peripheral surface of the micro device. With such design, when the micro device is delivered and transferred between different substrates to be applied to, for example, a micro device display, the breaking point of the holding structure can be controlled to be close to the boundary between the top surface and peripheral surface of the micro device, thereby reducing the problem that the holding structure is not completely broken or remained, such that the yield rate of delivery and transfer of the micro LED can be improved.

In order to make the aforementioned features and advantages of the disclosure more comprehensible, embodiments accompanying figures are described in detail below.

DESCRIPTION OF EMBODIMENTS

The embodiments of the invention describe the structure of micro device (e.g., micro LED) and micro chip) that is ready to be picked up and transferred to a receiving substrate. The receiving substrate may be, for example, a display substrate, a substrate having functional element such as transistor or integrated circuit (ICs) or other substrates with circuit, the invention is not limited thereto. Although some embodiments of the invention focus on micro LED containing p-n diode, it should be understood that the embodiments of the invention are not limited thereto. Some embodiments may be applied to other micro devices, and the devices are designed in this manner to control execution of predetermined electronic function (e.g., diode, transistor, integrated circuit) or photon function (e.g., LED, laser).

Figure 1A:
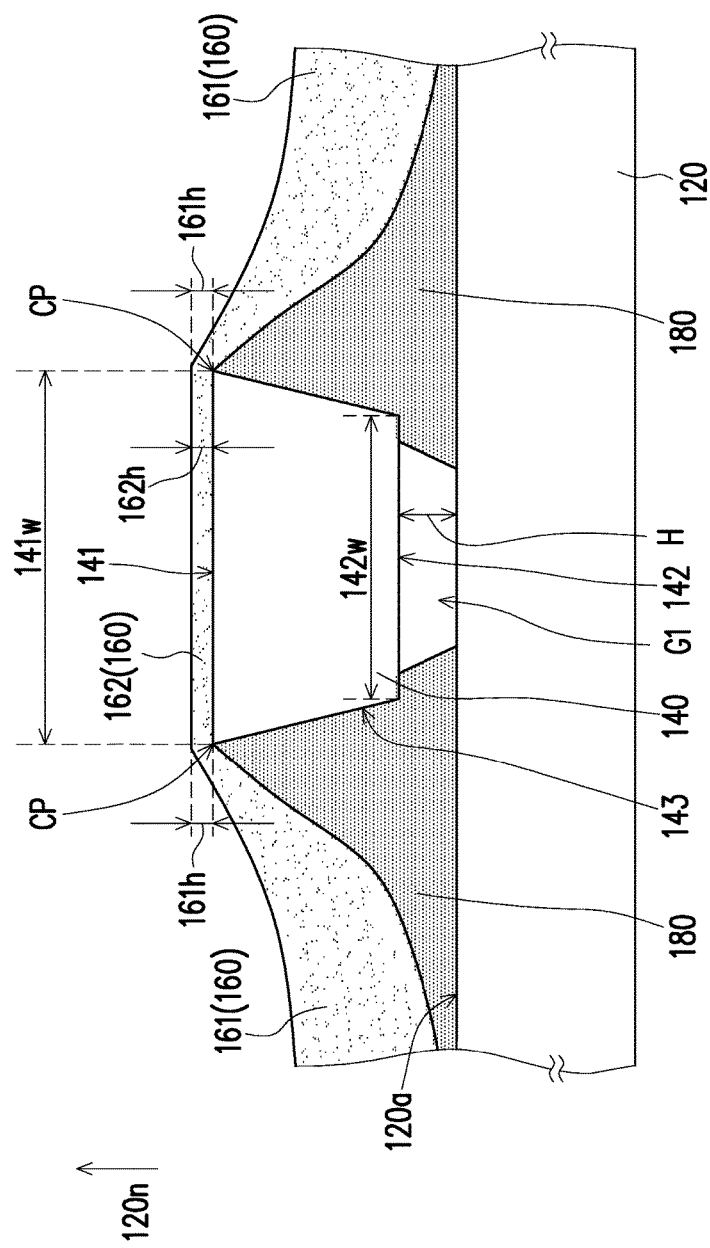
FIG. 1A is a schematic cross-sectional view of a structure with micro device according to a first embodiment of the invention.
Figure 1B:
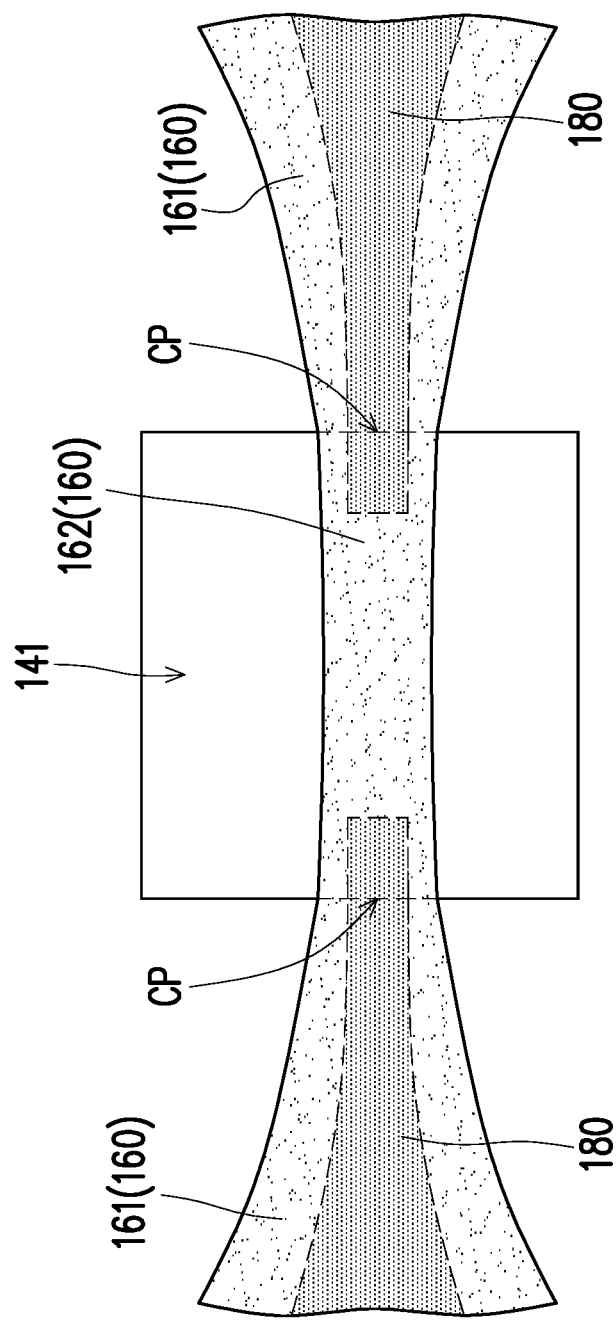
FIG. 1B is a schematic top view of the structure with micro device in FIG. 1A.

FIG. 1A is a schematic cross-sectional view of a structure with micro device according to a first embodiment of the invention. FIG. 1B is a schematic top view of the structure with micro device in FIG. 1A. Referring to FIG. 1A, a structure with micro device 100 in the embodiment includes a substrate 120, at least one micro device 140, and at least one holding structure 160 and at least one buffering structure 180. The micro device 140 is disposed on the substrate 120 and has a top surface 141 relatively far away from the substrate 120, a bottom surface 142 opposite to the top surface 141 and a peripheral surface 143 connecting the top surface 141 and the bottom surface 142. The holding structure 160 is disposed on the substrate 120. From the cross-sectional view, the thickness of the holding structure 160 in a normal direction 120n of the substrate 120 is gradually increased from a boundary CP between the top surface 141 and the peripheral surface 143 of the micro device 140 to the substrate 120. The buffering structure 180 is disposed between the holding structure 160 and the substrate 120, wherein the holding structure 160 is connected to the substrate 120 through the buffering structure 180.

In the embodiment, the substrate 120 is a temporary substrate that may have fixity and flat surface such as a plastic substrate, a glass substrate or a sapphire substrate, the invention is not limited thereto. As shown in the embodiment of FIG. 1A, the number of the micro device 140 is exemplified as one, but not limited thereto. In other embodiments, the number of the micro device 140 may be plural. Herein, a width 141w of the top surface 141 is larger than a width 142w of the bottom surface 142 such that a better tolerance rate and a better yield rate can be achieved when the micro device 140 is subsequently picked up by a transfer equipment (not shown) from the top surface 141. Briefly, the cross-sectional view of the micro device 140 may be an inverted trapezoid shape, but not limited thereto. Specifically, in the embodiment, the area of the bottom surface 142 of the micro device 140 is smaller than the area of the top surface 141 of the micro device 140, and the orthogonal projection of the bottom surface 142 of the micro device 140 on the substrate 120 falls within the orthogonal projection of the top surface 141 of the micro device 140 on the substrate 120 such that the micro device 140 has a better tolerance rate and a better yield rate when the micro device 140 is subsequently picked up by a transfer equipment (not shown) from the top surface 141. Herein, the micro device 140 may be a micro LED, and a largest size of the micro device 140 is smaller than or equal to 100 µm. Preferably, a largest size of the micro device 140 is smaller than or equal to 50 µm, and is thus more suitable to be applied to LED display technique using micro LED as pixel. In other embodiments, the micro device 140 may be a micro IC, a micro LD or a micro sensor, but not limited thereto.

Furthermore, a vertical distance H may be formed between the micro device 140 and the substrate 120 in the embodiment. In other words, the micro device 140 and the substrate 120 may not be directly in contact with each other. In some embodiments, the vertical distance H may be smaller than the maximum deformation amount of the holding structure 160. Herein, the maximum deformation amount refers to the value that causes the holding structure 160 to break. That is, the moving distance of the holding structure 160 along the vertical substrate exceeds the vertical distance H between the micro device 140 and the substrate 120, and the holding structure 160 may be broken. Herein, the vertical distance H is designed based on the height of the micro device 140. Preferably, the vertical distance H is larger than 0 and smaller than 0.5 times the height of the micro device 140. If the vertical distance H is larger than 0.5 times the height of the micro device 140, the height difference of the holding structure 160 is too large, as a result, the holding structure is difficult to be manufactured and might be broken easily. Generally speaking, the vertical distance H is in a range between 0.1 µm and 5 µm, but not limited thereto. Specifically, from the cross-sectional view, in the normal direction 120n of the surface 120a of the substrate 120, the thickness of the holding structure 160 is gradually increased from the boundary CP between the top surface 141 and the peripheral surface 143 of the micro device 140 to the surface 120a of the substrate 120. In other words, the holding structure 160 has a smallest thickness 161h at the boundary CP, and the thickness of the holding structure 160 is increased toward the direction of the substrate 120. That is to say, the thickness of the holding structure 160 is not fixed.

Furthermore, in the embodiment, the holding structure 160 may include a covering portion 162 and a plurality of connecting portions 161. As shown in FIG. 1B, the covering portion 162 covers a portion of the top surface 141 of the micro device 140. The connecting portion 161 connects the covering portion 162 from two opposite edges (i.e., two boundaries CP between the top surface 141 and the peripheral surface 143) of the top surface 141 and covers the buffering structure 180. That is, the connecting portion 161 extends from the boundary CP between the top surface 141 and the peripheral surface 143 of the micro device 140 to the substrate 120. Moreover, in the normal direction 120n of the surface 120a of the substrate 120, the thickness of the connecting portion 161 is gradually increased from the boundary CP to the surface 120a of the substrate 120. Briefly, the connecting portion 161 has the smallest thickness 161h at the boundary CP between the top surface 141 and the peripheral surface 143. The smallest thickness 161h is smaller than or equal to 1 µm. If the smallest thickness 161h is larger than 1 µm, it might increase the difficulty of the pick-up and transferring processes subsequently. As shown in FIG. 1A, a thickness 162h of the covering portion 162 may be consistent (if the possible rough surface of the covering portion 162 is neglected), and basically the thickness 162h of the covering portion 162 may be identical with the smallest thickness 161h of the connecting portion 161, but not limited thereto. It should be pointed out that a ratio of an orthogonal projection area of the holding structure 160 on the top surface 141 of the micro device 140 to an area of the top surface 141 is smaller than or equal to 0.2. If the ratio is larger than 0.2, the pick-up flatness of a transfer equipment (not shown) on the top surface 141 might be affected and consequently affecting the difficulty of the pick-up process.

Additionally, the buffering structure 180 of the embodiment is disposed between the holding structure 160 and the substrate 120 such that the connecting portion 161 of the holding structure 160 can be connected to the substrate 120 through the corresponding buffering structure 180. In the embodiment shown in FIG. 1A, the number of the buffering structure 180 is exemplified as two, but not limited thereto. In the embodiment, the material of the holding structure 160 is different from the material of the buffering structure 180, and the Young's modulus of the holding structure 160 is larger than the Young's modulus of the buffering structures 180. For example, the material of the holding structure 160 is, for example, silicon dioxide, silicon nitride, spin on glass (SOG) or other suitable inorganic materials, and the material of the buffering structure 180 is, for example, an organic material. The buffering structure 180 can absorb the external force that is applied to the holding structure 160 when holding the micro device 140 in the delivering and transferring processes, thereby improving the yield rate of delivery and transfer. Herein, in a unit area, a ratio of the orthogonal projection area of the buffering structure 180 on the substrate 120 to the orthogonal projection area of the holding structure 160 on the substrate 120 is in a range between 0.2 and 0.9. If the ratio is larger than 0.9, the holding force of the buffering structure 180 is too large, which affects subsequent transferring process. If the ratio is smaller than 0.2, the buffering force of the buffering structure 180 is not enough. More specifically, the buffering structure 180 of the embodiment completely covers the peripheral surface 143 of the micro device 140 and extends to cover a portion of the bottom surface 142, thereby achieving a better buffering effect. As shown in FIG. 1A, there may be no component provided between the buffering structure 180, the micro device 140 and the substrate 120. In other words, an air gap G1 is formed between the buffering structure 180, the micro device 140 and the substrate 120.

When the micro device 140 is picked up from the substrate 120, the force for picking up (e.g., press-down force or pull-up force) causes the holding structure 160 to break. Since the connecting portion 161 of the holding structure 160 has the smallest thickness 161h at the position of the boundary CP between the top surface 141 and the peripheral surface 143 of the corresponding micro device 140, and the micro device 140 is designed in a shape that is wide at the top and narrow at the bottom, the breaking point of the holding structure 160 can be close to or substantially located at the boundary CP between the top surface 141 and the peripheral surface 143 of the micro device 140. In this manner, the problem that the holding structure 160 is not completely broken or remained may be reduced, thereby improving the yield rate of delivering and transferring the micro device 140 to the subsequent circuit substrate (not shown).

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 2:
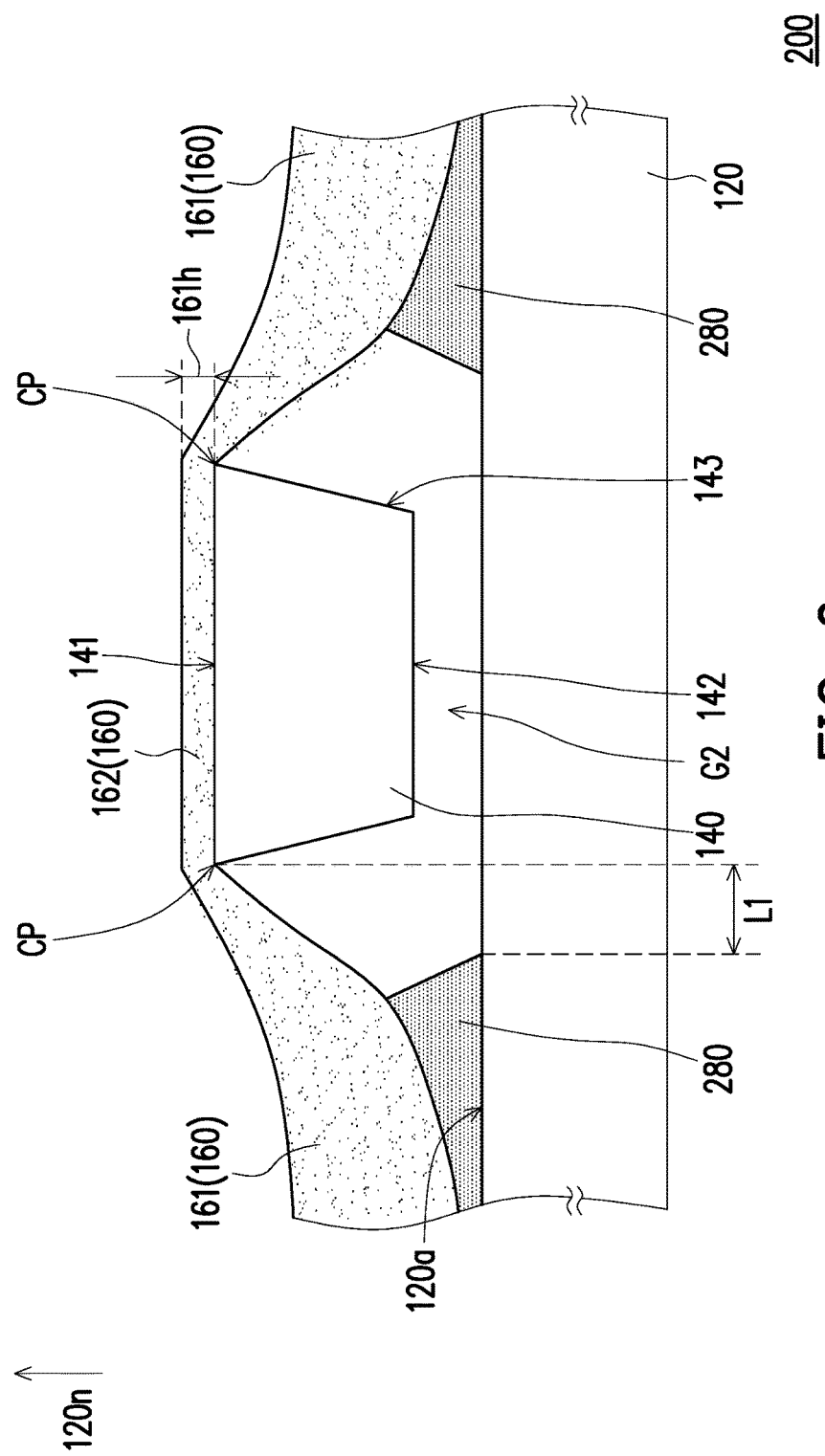
FIG. 2 is a schematic cross-sectional view of a structure with micro device according to a second embodiment of the invention.

FIG. 2 is a schematic cross-sectional view of a structure with micro device according to a second embodiment of the invention. A structure with micro device 200 in the embodiment is similar to the structure with micro device 100 in the first embodiment, and the difference between the two is that the configuration of a buffering structure 280 of the structure with micro device 200 in the embodiment is different from the configuration of the buffering structure 180 of the structure with micro device 100. In the embodiment, the buffering structure 280 is not in contact with the bottom surface 142 and the peripheral surface 143 of the micro device 140. In this manner, an air gap G2 is formed between the buffering structure 280 and the peripheral surface 143 of the micro device 140 and between the buffering structure 280, the bottom surface 142 of the micro device 140 and the substrate 120.

More specifically, the orthogonal projection of the buffering structure 280 on the surface 120a of the substrate 120 does not overlap the orthogonal projection of the micro device 140 on the surface 120a of the substrate 120. Moreover, a smallest distance L1 may be formed between the orthogonal projection of the buffering structure 280 on the substrate 120 and the orthogonal projection of the micro device 140 on the substrate 120, and the smallest distance L1 is smaller than or equal to 10 µm. With the configuration that the buffering structure 280 is not directly in contact with the micro device 140, it can be avoided that the holding force is too large and affects the subsequent pick-up force.

Figure 3A:
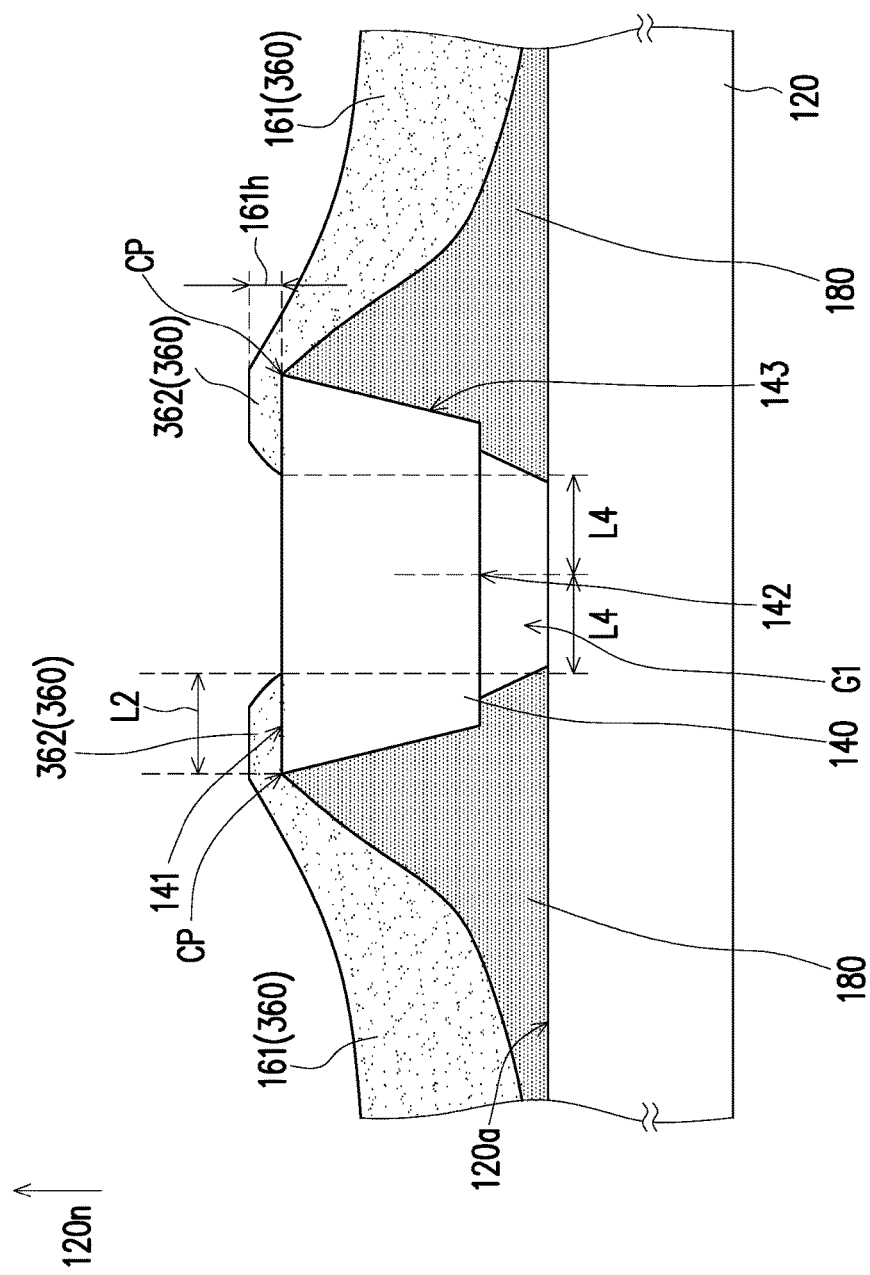
FIG. 3A is a schematic cross-sectional view of a structure with micro device according to a third embodiment of the invention.
Figure 3B:
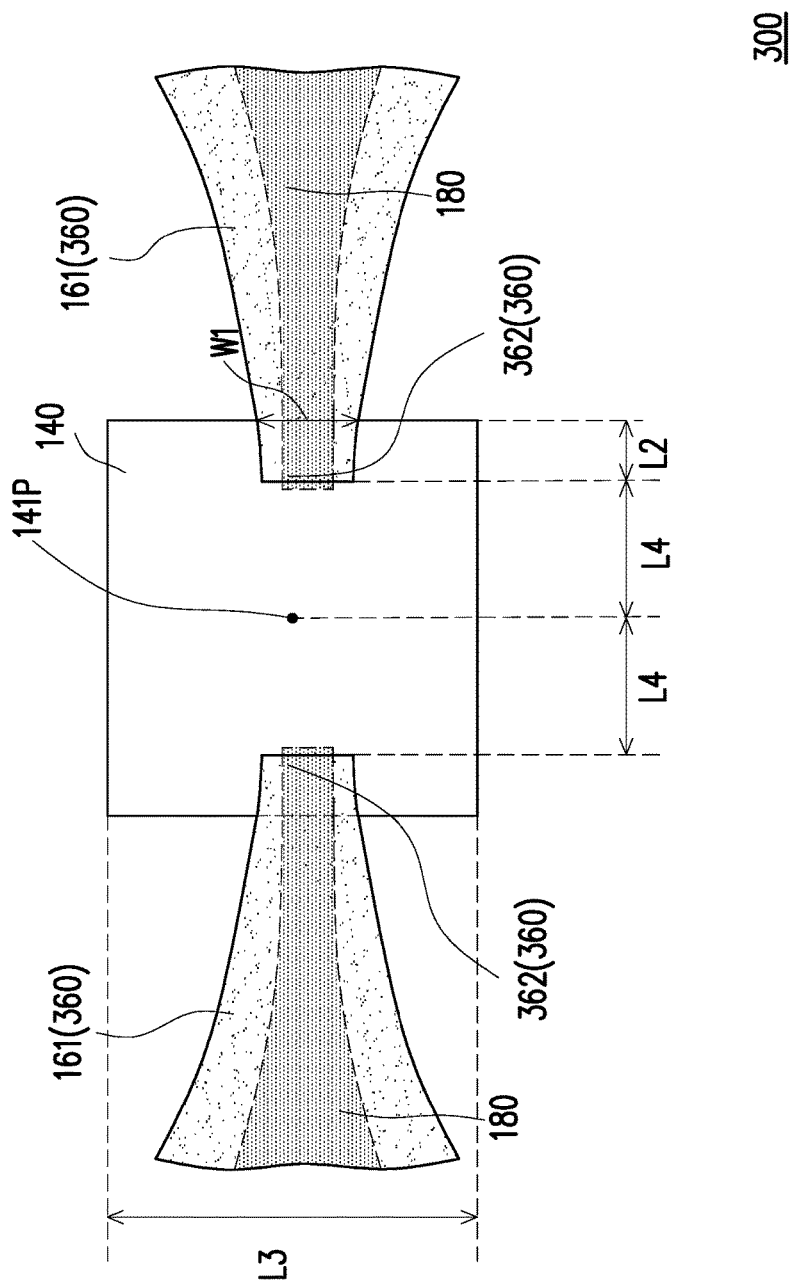
FIG. 3B is a schematic top view of a structure with micro device in FIG. 3A.

FIG. 3A is a schematic cross-sectional view of a structure with micro device according to a third embodiment of the invention. FIG. 3B is a schematic top view of a structure with micro device in FIG. 3A. A structure with micro device 300 in the embodiment is similar to the structure with micro device 100 in the first embodiment, and the difference between the two is that a holding structure 360 of the embodiment includes a plurality of covering portions 362 and a plurality of connecting portions 161, wherein the covering portions 362 are separated from each other and cover a portion of the top surface 141, and the connecting portion 161 connects the covering portion 362 from two opposite edges (i.e., two boundaries CP between the top surface 141 and the peripheral surface 143) of the top surface 141 and covers the buffering structure 180.

Figure 3C:
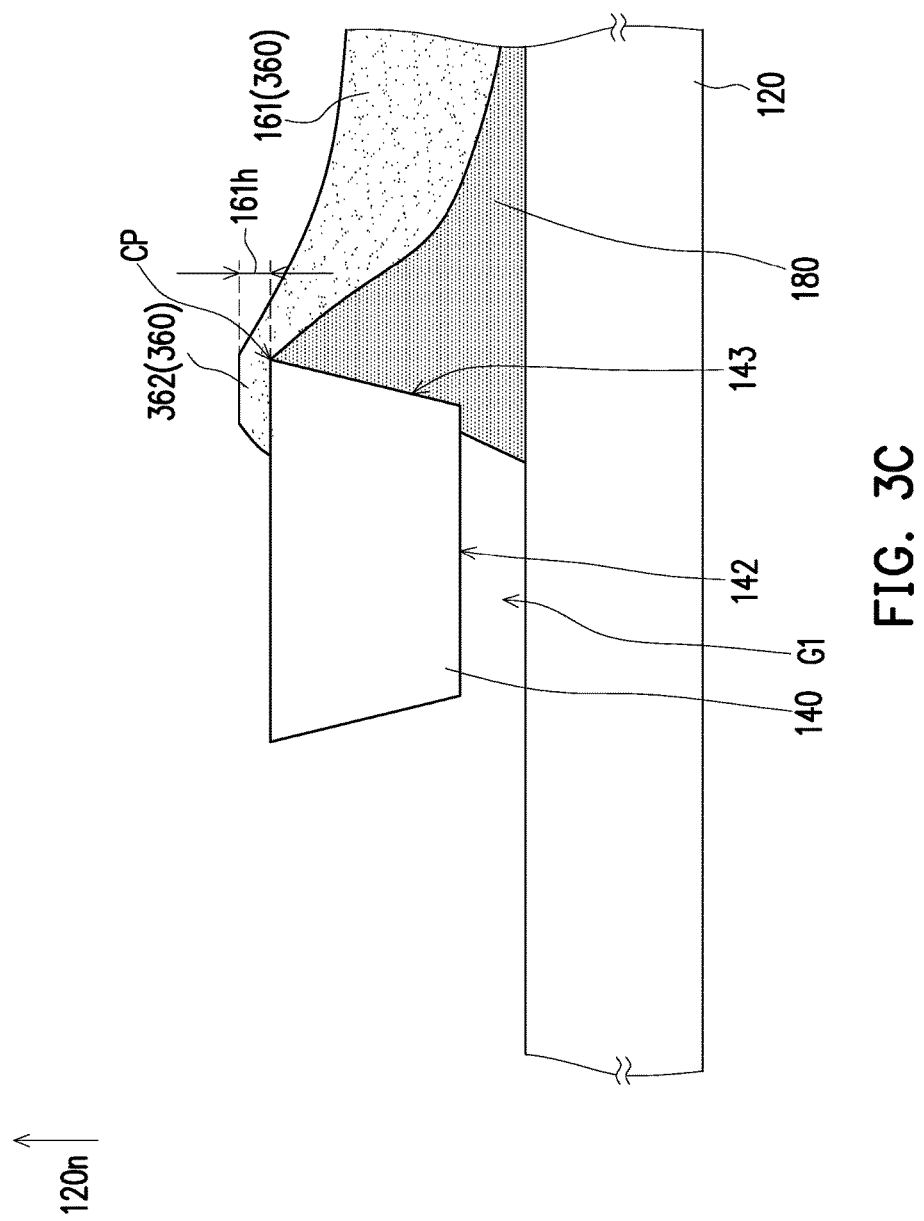
FIG. 3C is a schematic cross-sectional view of a structure with micro device according to a fourth embodiment of the invention.

More specifically, as shown in FIG. 3B, a largest distance L2 is formed between the covering portion 362 of the holding structure 360 and the corresponding edge of the top surface 141 of the micro device 140, and a ratio of the largest distance L2 to a length L3 of the edge is smaller than or equal to 0.2. The largest distance L2 is, for example, smaller than or equal to 10 μm. If the largest distance is larger than 10 μm, it might increase the difficulty of the pick-up process. Preferably, the largest distance L2 is, for example, smaller than or equal to 5 μm such that the subsequent pick-up process is easier, and the holding structure 360 can effectively hold the micro device 140. Additionally, a ratio of a width W1 of the connecting portion 161 on the edge of the top surface 141 of the micro device 140 to the length L3 of the corresponding edge is in a range between 0.01 and 0.6. If the ratio is smaller than 0.01, the holding structure 360 cannot effectively hold the micro device 140. That is, the holding force provided by the holding structure 360 is not big enough; on the contrary, if the ratio is larger than 0.6, the holding force provided by the holding structure 360 is too large, which causes that the micro device 140 cannot be smoothly picked up from the substrate 120. The width W1 is, for example, smaller than or equal to 20 μm. It should be indicated that the plurality of covering portions 362 and the plurality of connecting portions 161 are symmetrically disposed on two opposite edges of the top surface 141, and the shortest distances L4 from the orthogonal projection of the center 141P of the micro device 140 on the substrate 120 to each of the covering portions 362 are substantially the same, thereby providing a better subsequent transfer yield rate. It should be pointed out that the holding structure 360 and the buffering structure 180 may be only disposed on an edge of the micro device 140 as a structure with micro device 300' shown in FIG. 3C. In other words, the holding structure 360 only includes one covering portion 362 and one connecting portion 161. The covering portion 362 covers a portion of the top surface 141, the connecting portion 161 connects the covering portion 362 from an edge of the top surface 141 and covers the buffering structure 180, but not limited thereto.

Figure 4:
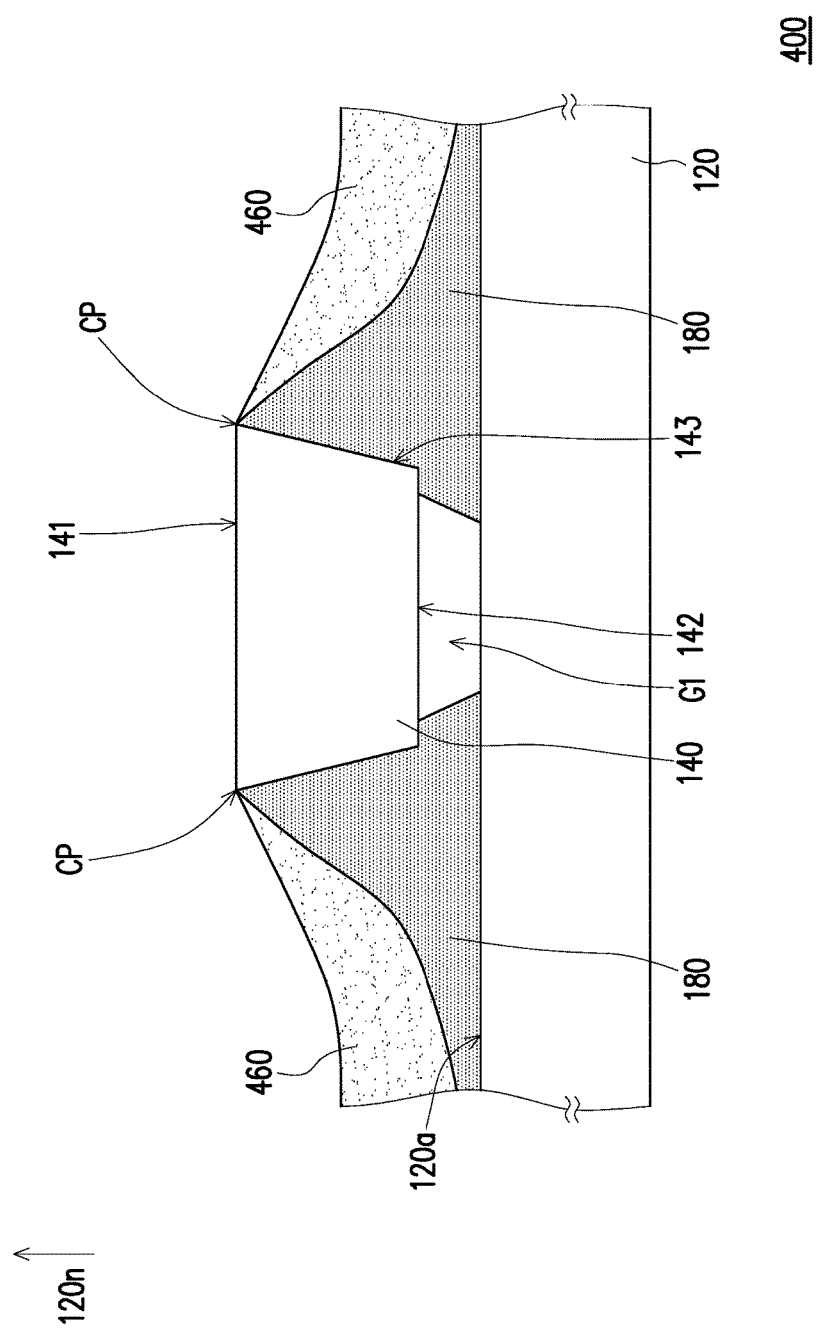
FIG. 4 is a schematic cross-sectional view of a structure with micro device according to a fifth embodiment of the invention.

FIG. 4 is a schematic cross-sectional view of a structure with micro device according to a fifth embodiment of the invention. A structure with micro device 400 in the embodiment is similar to the structure with micro device 100 in the first embodiment, and the difference between the two is that a holding structure 460 of the embodiment completely exposes the top surface 141 of the micro device 140 and covers the buffering structure 180, wherein the buffering structure 180 completely covers the peripheral surface 143 of the micro device 140 and extends to cover a portion of the bottom surface 142. However, in other embodiments, the buffering structure 180 may only cover a portion of the peripheral surface 143 of the micro device 140, but not limited thereto.

Figure 5:
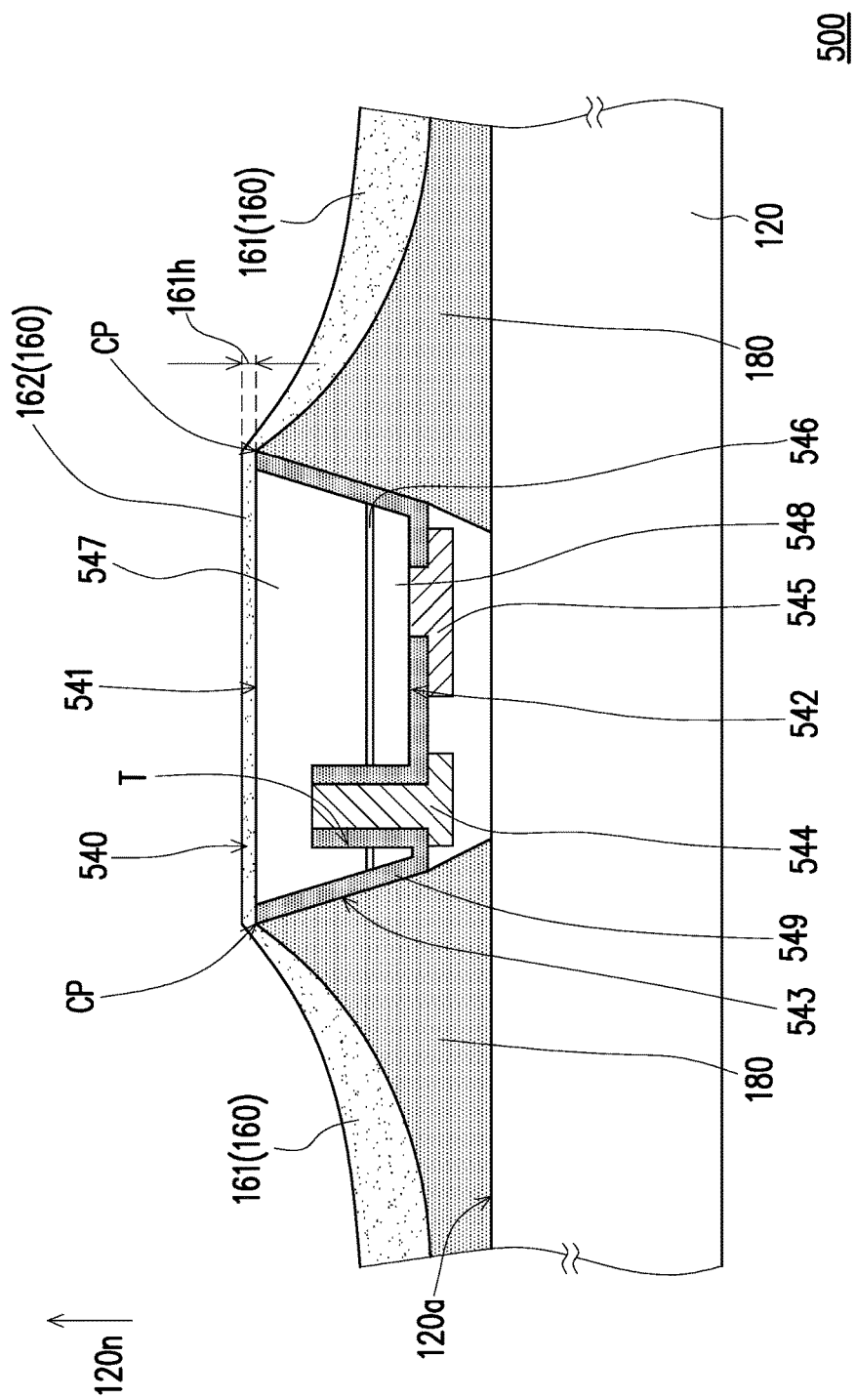
FIG. 5 is a schematic cross-sectional view of a structure with micro device according to a sixth embodiment of the invention.

FIG. 5 is a schematic cross-sectional view of a structure with micro device according to a sixth embodiment of the invention. A structure with micro device 500 of the embodiment is similar to the structure of the micro device 100 of the first embodiment, and the difference between the two is that a micro device 540 of the embodiment includes a first type electrode 544 and a second type electrode 545 disposed on the same surface. Specifically, the micro device 540 includes a first type semiconductor layer 547, a light emitting layer 546, a second type semiconductor layer 548, an insulating layer 549, a through hole T, the first type electrode 544 and the second type electrode 545. The through hole T penetrates through the second type semiconductor layer 548, the light emitting layer 546 and a portion of the first type semiconductor layer 547 in sequence. The insulating layer 549 covers the peripheral surface 543, a portion of the bottom surface 542 and the inner wall of the through hole T. The holding structure 160 is directly in contact with the top surface 541 and the insulating layer 549 disposed on the peripheral surface 543. The first type electrode 544 and the second type electrode 545 are disposed on the bottom surface 542, and the first type electrode 544 is filled in the through hole T and electrically connected with the first type semiconductor layer 547, and the second type electrode 545 passes through the insulating layer 549 on the bottom surface 542 and electrically connected with the second type semiconductor layer 548.

In the embodiment, the material of the holding structure 160 may be different from the material of the insulating layer 549, wherein the material of the holding structure 160 is an inorganic material, such as silicon dioxide, silicon nitride, spin on glass (SOG) or other suitable materials. Herein, the material of the insulating layer 549 is an inorganic material such as silicon dioxide, silicon nitride, spin on glass (SOG) or other suitable material in order to protect the micro device 540 from being affected by outer environment, thereby increasing the service life of the micro device 540. In the embodiment, the holding structure 160 is SOG, the insulating layer 549 is $SiO_2$, but not limited thereto. Preferably, the hardness of the holding structure 160 is lower than or equal to the hardness of the insulating layer 549. Preferably, the thickness of the holding structure 160 is smaller than or equal to the thickness of the insulating layer 549. In this manner, it can be avoided that the holding structure 160 and the insulating layer 549 are removed simultaneously when the micro device 540 is transferred. Additionally, the center of gravity of the holding structure 160 is lower than the center of gravity of the micro device 140 and thus a more stable holding effect can be achieved.

In summary, in the design of the structure with micro device of the invention, from the cross-sectional view, the thickness of the holding structure in the normal direction of the substrate is gradually increased from the boundary between the top surface and the peripheral surface of the micro device to the substrate. In other words, the holding structure has the smallest thickness at the boundary between the top surface and the peripheral surface of the micro device. With such design, when the micro device is delivered and transferred between different substrates, the breaking point of the holding structure can be controlled to be close to the boundary between the top surface and peripheral surface of the micro device, thereby reducing the problem that the holding structure is not completely broken or remained, such that the yield rate of delivery and transfer of the micro LED can be improved.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A structure with micro device, comprising:
   a substrate;
   at least one micro device, disposed on the substrate and having a top surface away from the substrate, a bottom surface opposite to the top surface and a peripheral surface connecting the top surface and the bottom surface;
   at least one holding structure, disposed on the substrate, wherein from a cross-sectional view, a thickness of the at least one holding structure in a normal direction of the substrate is gradually increased from a boundary between the top surface and the peripheral surface of the at least one micro device to the substrate; and
   at least one buffering structure, disposed between the at least one holding structure and the substrate, wherein the at least one holding structure is connected to the substrate through the buffering structure.

2. The structure with micro device according to claim 1, wherein the at least one holding structure completely exposes the top surface of the at least one micro device and covers the buffering structure.

3. The structure with micro device according to claim 1, wherein the at least one holding structure comprises a plurality of covering portions and a plurality of connecting portions, the covering portions are separated from each other and cover a portion of the top surface, and each of the connecting portions connects the covering portions from an edge of the top surface and covers the buffering structure.

4. The structure with micro device according to claim 3, wherein a largest distance is formed between each of the covering portions and the corresponding edge of the top surface, and a ratio of the largest distance to a length of the edge is smaller than or equal to 0.2.

5. The structure with micro device according to claim 3, wherein a ratio of a width of each of the connecting portions on the edge of the top surface to a length of the corresponding edge is in a range between 0.01 and 0.6.

6. The structure with micro device according to claim 3, wherein shortest distances from an orthogonal projection of a center of the at least one micro device on the substrate to an orthogonal projection of each of the covering portions on the substrate are the same.

7. The structure with micro device according to claim 1, wherein the at least one holding structure comprises a covering portion and at least one connecting portion, the covering portion covers a portion of the top surface, and the connecting portion connects the covering portion from an edge of the top surface and covers the buffering structure.

8. The structure with micro device according to claim 7, wherein a ratio of a width of the connecting portion on the edge of the top surface to a length of the corresponding edge is in a range between 0.01 and 0.6.

9. The structure with micro device according to claim 1, wherein in a unit area, a ratio of an orthogonal projection area of the buffering structure on the substrate to an orthogonal projection area of the at least one holding structure on the substrate is in a range between 0.2 and 0.9.

10. The structure with micro device according to claim 1, wherein the buffering structure is away from the at least one micro device.

11. The structure with micro device according to claim 10, wherein a smallest distance is formed between an orthogonal projection of the buffering structure on the substrate and an orthogonal projection of the at least one micro device on the substrate, and the smallest distance is smaller than or equal to 10 μm.

12. The structure with micro device according to claim 1, wherein a ratio of an orthogonal projection area of the at least one holding structure on the top surface of the at least one micro device to an area of the top surface is smaller than or equal to 0.2.

13. The structure with micro device according to claim 1, wherein a material of the at least one holding structure is different from a material of the buffering structure, and the Young's modulus of the at least one holding structure is larger than the Young's modulus of the buffering structure.

14. The structure with micro device according to claim 1, wherein the at least one micro device further comprises an insulating layer, and the insulating layer at least covers the peripheral surface and a portion of the bottom surface, and the at least one holding structure is directly in contact with the insulating layer.

15. The structure with micro device according to claim 14, wherein a material of the at least one holding structure is different from a material of the insulating layer.

16. The structure with micro device according to claim 14, wherein a thickness of the at least one holding structure is smaller than or equal to a thickness of the insulating layer.

17. The structure with micro device according to claim 14, wherein a hardness of the holding structure is less than a hardness of the insulating layer.

18. The structure with micro device according to claim 1, wherein a center of gravity of the at least one holding structure is lower than a center of gravity of the at least one micro device.

19. The structure with micro device according to claim 1, wherein a width of the top surface is larger than a width of the bottom surface.

* * * * *